(12) United States Patent
Huitema et al.

(10) Patent No.: US 12,125,431 B2
(45) Date of Patent: *Oct. 22, 2024

(54) LOCAL ACTIVE MATRIX ARCHITECTURE

(71) Applicant: Apple Inc., Cupertino, CA (US)

(72) Inventors: Hjalmar Edzer Ayco Huitema, Lexington, MA (US); Thomas Charisoulis, San Carlos, CA (US); Xia Li, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/350,366

(22) Filed: Jul. 11, 2023

(65) Prior Publication Data

US 2023/0360593 A1 Nov. 9, 2023

Related U.S. Application Data

(63) Continuation of application No. 17/662,212, filed on May 5, 2022, now Pat. No. 11,749,180, which is a
(Continued)

(30) Foreign Application Priority Data

Feb. 27, 2020 (EP) .................... 20159853

(51) Int. Cl.
*G09G 3/32* (2016.01)
*G09G 3/20* (2006.01)
(Continued)

(52) U.S. Cl.
CPC ............ *G09G 3/32* (2013.01); *G09G 3/2003* (2013.01); *H01L 25/167* (2013.01);
(Continued)

(58) Field of Classification Search
CPC ................. G09G 3/32; G09G 3/2003; G09G 2300/0814; G09G 2300/0842;
(Continued)

(56) References Cited

U.S. PATENT DOCUMENTS 8,159,424 B2  4/2012  Yamamoto et al.
9,293,088 B2  3/2016  Yoshida et al.
(Continued)

FOREIGN PATENT DOCUMENTS

EP  3343551 A1  7/2018
JP  2007122080 A  5/2007
(Continued)

OTHER PUBLICATIONS

European Patent Application No. EP20159853, "Extended European Search Report", mailed Apr. 8, 2020, 11 pages.
(Continued)

*Primary Examiner* — Vijay Shankar
(74) *Attorney, Agent, or Firm* — Aikin & Gallant, LLP

(57) ABSTRACT

A local active matrix display panel, circuits and methods of operation are described. In an embodiment, a local active matrix display panel includes an array of pixel driver chip, a thin film transistor layer in electrical contact with the array of pixel driver chips, and an array of light emitting diodes electrically connected with the thin film transistor layer.

20 Claims, 11 Drawing Sheets

Related U.S. Application Data continuation of application No. 17/161,467, filed on Jan. 28, 2021, now Pat. No. 11,355,056.

(51) Int. Cl.
*H01L 25/16* (2023.01)
*H01L 27/12* (2006.01)

(52) U.S. Cl.
CPC ... *H01L 27/124* (2013.01); *G09G 2300/0814* (2013.01); *G09G 2300/0842* (2013.01); *G09G 2320/043* (2013.01); *G09G 2320/0626* (2013.01)

(58) Field of Classification Search
CPC ..... G09G 2320/043; G09G 2320/0626; G09G 2300/026; G09G 2300/0408; G09G 2300/0804; G09G 2300/0861; G09G 2310/0221; G09G 2330/10; G09G 2330/12; G09G 3/3216; G09G 3/3233; H01L 25/167; H01L 27/124
See application file for complete search history.

(56) References Cited

U.S. PATENT DOCUMENTS

| | | | |
|---|---|---|---|
| 10,204,540 B2 | 2/2019 | Chaji | |
| 10,395,589 B1 | 8/2019 | Vahid Far et al. | |
| 10,395,594 B1 | 8/2019 | Charisoulis et al. | |
| 10,483,253 B1 | 11/2019 | Hu | |
| 10,573,632 B2 | 2/2020 | Yeon et al. | |
| 10,593,743 B2 | 3/2020 | Son et al. | |
| 10,650,737 B2 | 5/2020 | Vahid Far et al. | |
| 11,355,056 B2 | 6/2022 | Huitema et al. | |
| 11,749,180 B2 * | 9/2023 | Huitema | G09G 3/2003 345/694 |
| 2003/0160803 A1 | 8/2003 | Willis | |
| 2017/0179097 A1 | 6/2017 | Zhang et al. | |
| 2018/0190747 A1 | 7/2018 | Son et al. | |
| 2018/0247586 A1 | 8/2018 | Vahid Far et al. | |
| 2019/0043845 A1 | 2/2019 | Bibl et al. | |
| 2019/0122600 A1 | 4/2019 | Chaji | |
| 2019/0385509 A1 | 12/2019 | Lu et al. | |
| 2021/0272510 A1 | 9/2021 | Huitema et al. | |
| 2022/0366838 A1 * | 11/2022 | Huitema | G09G 3/2003 |
| 2023/0086380 A1 * | 3/2023 | Charisoulis | G01R 31/2635 345/691 |
| 2023/0360593 A1 * | 11/2023 | Huitema | G09G 3/3233 |

FOREIGN PATENT DOCUMENTS

| | | |
|---|---|---|
| KR | 20180118090 A | 10/2018 |
| KR | 20190137458 A | 12/2019 |

OTHER PUBLICATIONS

PCT/US2021/015546, "PCT International Search Report and Written Opinion", mailed May 17, 2021, 11 pages.

\* cited by examiner

LOCAL ACTIVE MATRIX ARCHITECTURE

RELATED APPLICATIONS

This application is a continuation of co-pending U.S. patent application Ser. No. 17/662,212, filed May 5, 2022, which is a continuation of U.S. application Ser. No. 17/161,467, filed Jan. 28, 2021, now issued as U.S. Pat. No. 11,355,056, which claims the benefit of priority of European Patent Application No. EP20159853.9, filed Feb. 27, 2020. U.S. application Ser. No. 17/161,467 and European Patent Application No. EP20159853.9 are incorporated herein by reference.

BACKGROUND

Field

Embodiments described herein relate to a display system, and more particularly to local active matrix displays and methods of operation.

Background Information

Display panels are utilized in a wide range of electronic devices. Common types of display panels include active matrix display panels where each pixel element, e.g. light emitting diode (LED), may be individually driven to display a data frame, and passive matrix display panels where rows and columns of pixel elements may be driven in a data frame. Frame rate can be tied to display artifacts and may be set at a specified level based on display application.

Conventional organic light emitting diode (OLED), or liquid crystal display (LCD) technologies feature a thin film transistor (TFT) substrate. More recently, it has been proposed to replace the TFT substrate with an array of pixel driver chips (also referred to as micro driver chips, or microcontroller chips) bonded to a substrate and integrate an array of micro LEDs (µLEDs) with the array of pixel driver chips, where each pixel driver chip is to switch and drive a corresponding plurality of the micro LEDs. Such micro LED displays can be arranged for either active matrix or passive matrix addressing.

In one implementation described in U.S. Publication No. 2019/0347985 a local passive matrix (LPM) display includes an arrangement of pixel driver chips and LEDs in which each pixel driver chip is coupled with an LPM group of LEDs arranged in display rows and columns. In operation global data signals are transmitted to the pixel driver chip, and each display row of LEDs in the LPM group is driven by the pixel driver chip one display row at a time.

SUMMARY

Local active matrix architectures including display panel stack-ups, circuits and methods of operation are described. In an embodiment, a local active matrix display panel includes an array of pixel driver chips, a thin film transistor layer over and in electrical contact with the array of pixel driver chips, and an array of light emitting diodes on the thin film transistor layer. Each pixel driver chip may be electrically connected to a corresponding matrix of LEDs and corresponding local pixel circuit matrix in the TFT layer. In operation, the pixel driver chips provide local matrix digital driving capability, while the TFT layer provides sample-and-hold and current source capability per sub-pixel. Such an arrangement may maximize emission duty cycle irrespective of LED matrix size and facilitate operation of the display panel at high multiplexing ratios.

DETAILED DESCRIPTION

Embodiments describe local active matrix (LAM) display configurations and methods of operation. A local active matrix (LAM) architecture in accordance with embodiments may combine features of both active matrix and passive matrix architectures. More specifically, LAM display configurations can include an array of pixel driver chips mainly to provide digital functionality, and an overlying TFT array including local subpixel circuitry to provide analog functionality. In operation, LAM addressing includes active matrix driving with local updating. Thus, the pixel driver chips may update with multiplexing and row sharing, while a mostly passive TFT overlay is set to the LED driving current value and is always on until it is reprogrammed. In an alternative configuration, the array of pixel driver chips is placed onto a TFT underlay, which can perform the same mostly passive function.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between" and "on" as used herein may refer to a relative position of one layer with respect to other layers. One layer "above", "over" or "on" another layer or bonded "to" or in "contact" with another layer may be directly in contact with the other layer or may have one or more intervening layers. One layer "between" layers may be directly in contact with the layers or may have one or more intervening layers.

Figure 1:
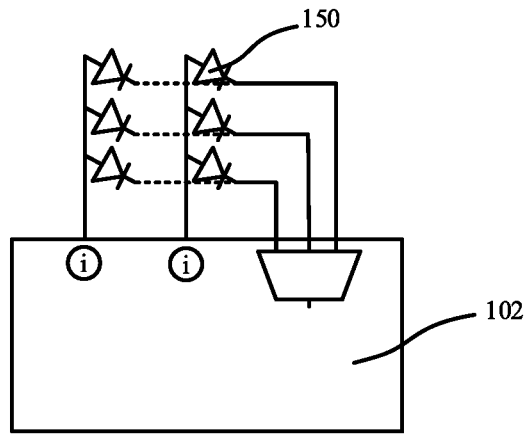
FIG. 1 is a generalized circuit diagram of an active matrix architecture.

FIG. 1 is a generalized circuit diagram of a local passive matrix (LPM) architecture. As shown in the exemplary layout, current sources (i) are provided to each column of LEDs 150, where grey level can be modulated using pulse width modulation of a constant current. In operation, sequential emission of each row can be accomplished by multiplexing such that only one row is selected for emission at a time. Thus, the emission current to a display row is turned off before being applied to the next display row. It has been observed that sharing an LPM emission duty cycle between display rows (e.g. driving one display row at a time) results in a relationship of reduced emission time as a function of the number of rows driven by a same pixel driver chip 102. Furthermore, it has been observed that such a reduced emission time as a result of row sharing can affect peak display brightness. This can be compensated to some extent by raising the current range needed to drive the LEDs. However, this can result in the LEDs being operated at non-optimal efficiencies (e.g. in the characteristic internal quantum efficiency curve of the LEDs) and lifetime degradation. Thus, for a given frame rate, and particularly at high frame rates, scaling of the LPM multiplexing ratio (i.e. the number of rows, or matrix size, which can be driven by a pixel driver chip) can be constrained.

Figure 2:
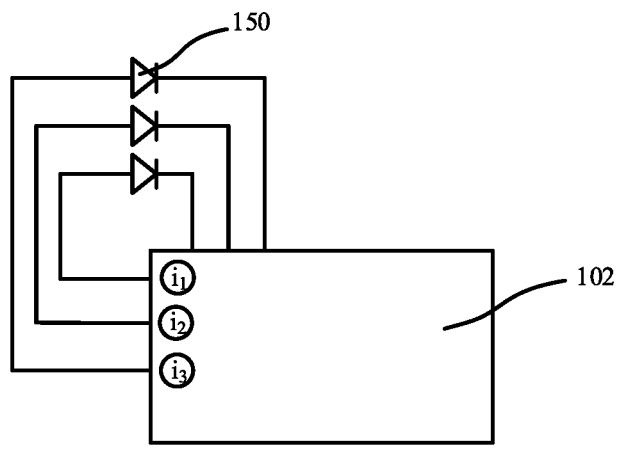
FIG. 2 is a generalized circuit diagram of a local passive matrix architecture.

FIG. 2 is a generalized circuit diagram of an active matrix (AM) architecture. As shown in the exemplary layout, each LED 150 has its own dedicated current source, $i_1$, $i_2$, $i_3$, etc. It has been observed that the area required for driving electronics associated with AM display panels with a high pixel density can be prohibitive. Furthermore, the amount of driving electronics, such as row drivers, column drivers, multiplexers, etc. can increase border area around the display. While AM digital backplanes are possible, AM backplanes are generally analog, using a large amount of digital to analog converters (DAC s) to generate analog current levels for driving LEDs, where grey scale is typically modulated with amplitude modulation.

Figure 3:
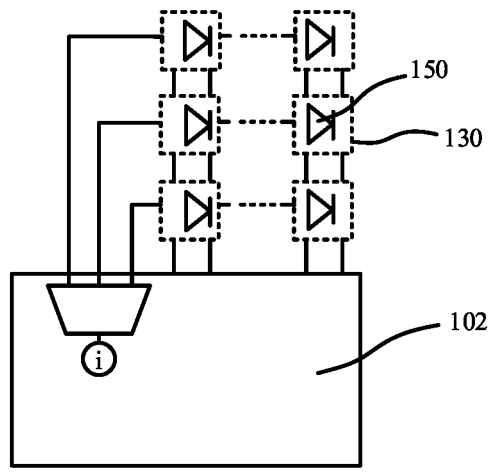
FIG. 3 is a generalized circuit diagram of a local active matrix architecture in accordance with an embodiment.

FIG. 3 is a generalized circuit diagram of a local active matrix (LAM) architecture in accordance with an embodiment. The LAM architecture and addressing schemes in accordance with embodiments enable digital driving at higher multiplexing ratios than possible with LPM addressing, and with reduced power consumption and complexity of AM addressing. LAM decouples the emission time from the program time so that a desired display brightness can be achieved at optimal LED efficiency and driving current. Thus, at any given frame rate (e.g. required by display artifact performance) LAM can allow for larger LED matrix size or multiplexing ratio while keeping pixel driver chip size and cost down.

In operation grey scale can be modulated using pulse width modulation. As shown, a corresponding local subpixel circuit 130 is located between each LED 150 and the pixel driver chip 102. For example, the local subpixel circuit 130 can be located in a thin film transistor (TFT) stack between the pixel driver chips and a display effect layer (e.g., OLED, µLED). The TFT stack provides the sample-and-hold and current source capability per sub-pixel. The pixel driver chips provide local matrix digital driving capability. Such an arrangement may allow for 100% emission duty cycle irrespective of LED matrix size corresponding to the number of LEDs (and rows) connected to a single pixel driver chip 102. Thus, this allows for operation at a high multiplexing ratio. Such an arrangement can also reduce driving currents compared to LPM. For example, scaling LPM to larger matrix sizes can require an increased driving current to achieve necessary brightness. This can be problematic for matching micro LED efficiency curves, and OLED lifetime. LAM addressing can allow for lower driving currents and is thus applicable for both µLED and OLED. Furthermore, LAM arrangements can be compatible with reduced borders along edges of the display panel, availability of cut-outs, and alternative backplane shapes.

Figure 4A:
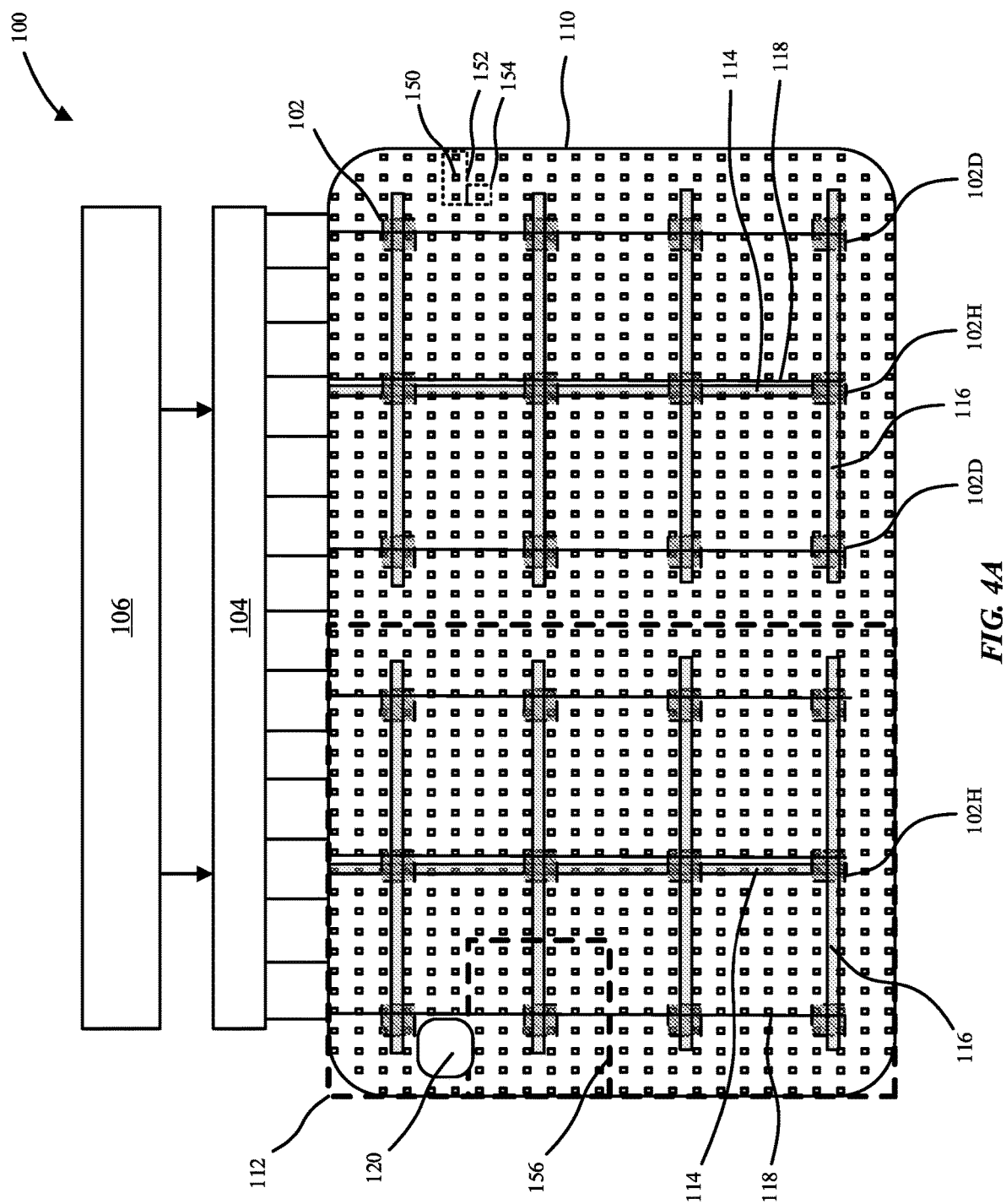
FIGS. 4A-4C are a schematic top layout view of display systems in accordance with embodiments.

Referring now to FIG. 4A, a schematic top layout view illustration is provided of a display system in accordance with an embodiment. As shown, the display system 100 includes a display panel 110 which includes an array of pixel driver chips 102 interspersed within a display area of the display panel 110 along with an array of LEDs 150. The LEDs 150 may be arranged in an array of pixels 152, with each pixel 152 including multiple subpixels 154. Each subpixel may be designed for emission of a different color. In an exemplary arrangement, the subpixels 154 are arranged with red-green-blue (RGB) emitting LEDs 150, though other arrangements are possible. In an embodiment, each subpixel 154 includes a pair of redundant LEDs 150 including a primary LED and a redundant LED which can be driven as a result of a defective or missing primary LED or circuitry. The display area may be considered area including LEDs 150 in the pixel array.

A control circuit 104 may be coupled to the display panel 110 to supply various control signals, video signals, and power supply voltage to the display panel 110. The control circuit 140 may include a timing controller (TCON). For example, the control circuit 104 can be placed on a chip on film, flex circuit, etc. Additional system components 106 can be coupled with the control circuit 104, or directly to the display panel 110. For example, the additional system components 106 can include a host system on chip (SOC), power management integrated circuit (PMIC), level shifters, touch screen controller, additional passives, etc.

The particular display panel 110 illustrated in FIG. 4A may be characterized as a tiled display including a plurality of tiles 112. The arrangement of pixel driver chips 102 in accordance with embodiments can remove the requirement for driver ledges on the edges of a display panel. As a result, the display panel may have reduced borders, or zero borders outside of the display area. The configuration may facilitate the formation of display panels with curved edges, as well as cutouts 120. In addition, the configuration may facilitate modular arrangements, including micro arrangements, of display tiles 112. Generally, the control circuit 104 may be coupled to an edge of the display panel 110. Bus columns 114 of global signal lines and/or power lines may extend from the control circuit 104 to supply global signals to the display panel. For example, the global signal lines may include at least data clock lines and emission clock lines. The global signal lines are coupled to a plurality of "hybrid" pixel driver chips 102H, and together form a backbone of the display, or display tile 112. The corresponding backbone hybrid pixel driver chips receive the global signals and then transmit manipulated signals to their corresponding rows as row signal lines 116 connected to the other pixel driver chips 102 within the same row. For example, the global data clock and emission clock signals may be converted to manipulated signals and transmitted to the row of pixel driver chips 102 along manipulated data clock lines and manipulated emission clock lines. For example, the manipulated signals may include only the necessary information for the particular row of pixel driver chips.

The tile-based display panels in accordance with embodiments may have various arrangements of display tiles 112. For example, the display tiles 112 may be arranged side-by-side (horizontally), stacked (vertically), both, as well as other configurations. Additionally, the bus columns 114 of global signal lines may be aligned and connected for stacked display tiles 112. Bus columns 114 and data lines 118 may extend from the control circuit 104 to the display panel. Column drivers may optionally be located on the display panel 110 to buffer the global signal lines in the bus columns 114 and/or data lines 118. Each tile 112 may include one or more bus columns 114 of global signal lines, a plurality of rows of row function signal lines 116, and a plurality of rows of pixel driver chips 102, with each row of pixel driver chips 102 connected to a corresponding row of row function signal lines 116. Additionally, each pixel driver chip 102 is connected to corresponding matrix 156 of LEDs 150.

As shown in FIG. 4A, each row of pixel driver chips 102 includes a group of backbone hybrid pixel driver chips 102H and a group of LED driving pixel driver chips 102D. The routing of the bus columns 114 and backbone hybrid pixel driver chips 102H may form a backbone of the tiles 112. Each of the backbone hybrid pixel driver chips 102H and LED driving pixel driver chips 102D may be hybrid pixel driver chips, only configured differently for different function. Alternatively, chips 102H, 102D may have different internal circuitries. The backbone hybrid pixel driver chips 102H and LED driving pixel driver chips 102D may additionally be connected differently. In accordance with embodiments, each of the backbone hybrid pixel driver chips 102H and LED driving pixel driver chips 102D are connected to corresponding matrices 156 of LEDs 150 via TFT local subpixel circuitries.

Figure 4B:
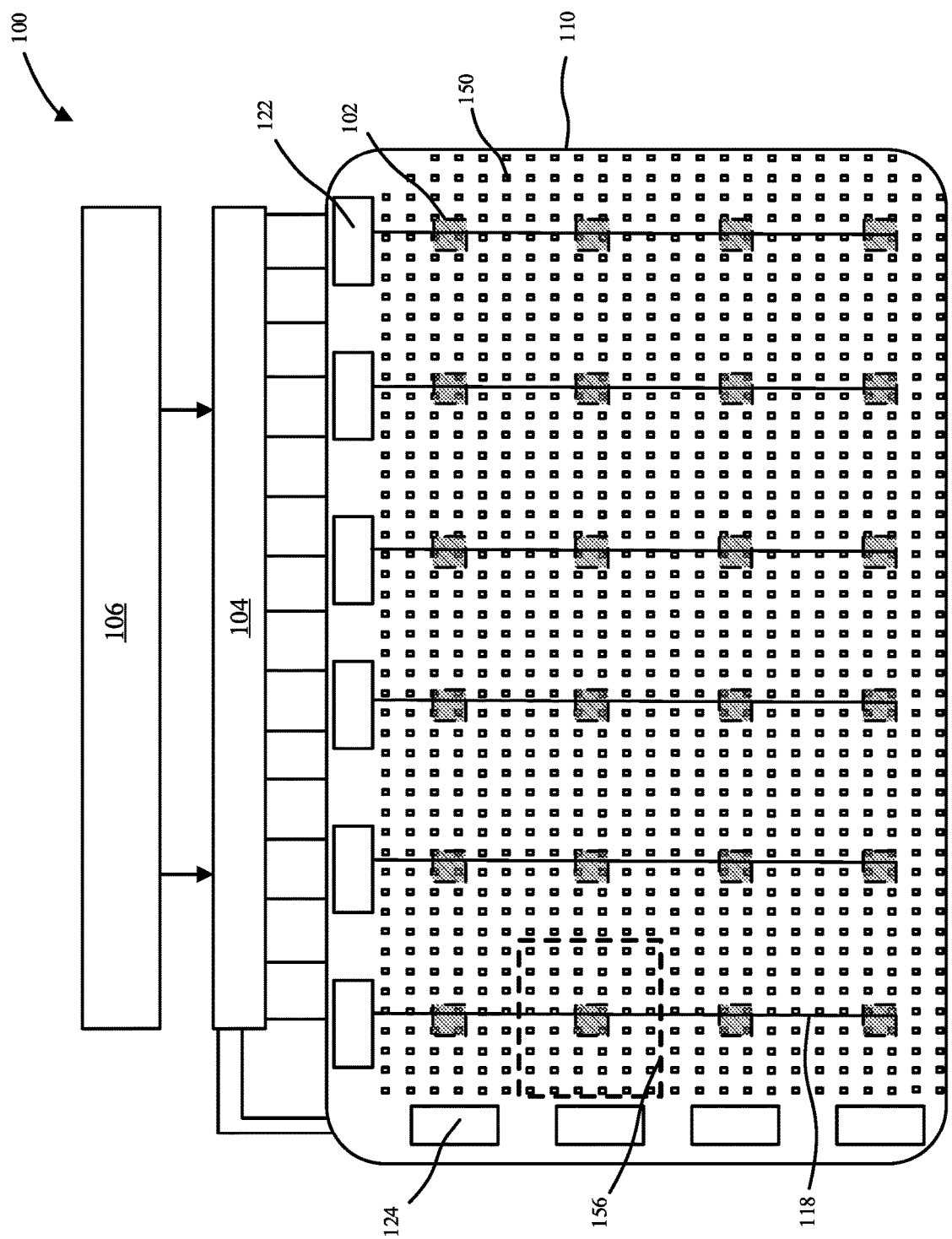

Referring now to FIG. 4B, an alternative display system 100 is illustrated including column drivers 122 and row drivers 124, which can be arranged on or connected to edges of the display panel 110. Column drivers 122 may buffer the global data signals for example, before transmitting to the data lines 118. Row drivers 124 may buffer global row function signals, for example, before transmitting to the rows of pixel driver chips 102.

Figure 4C:
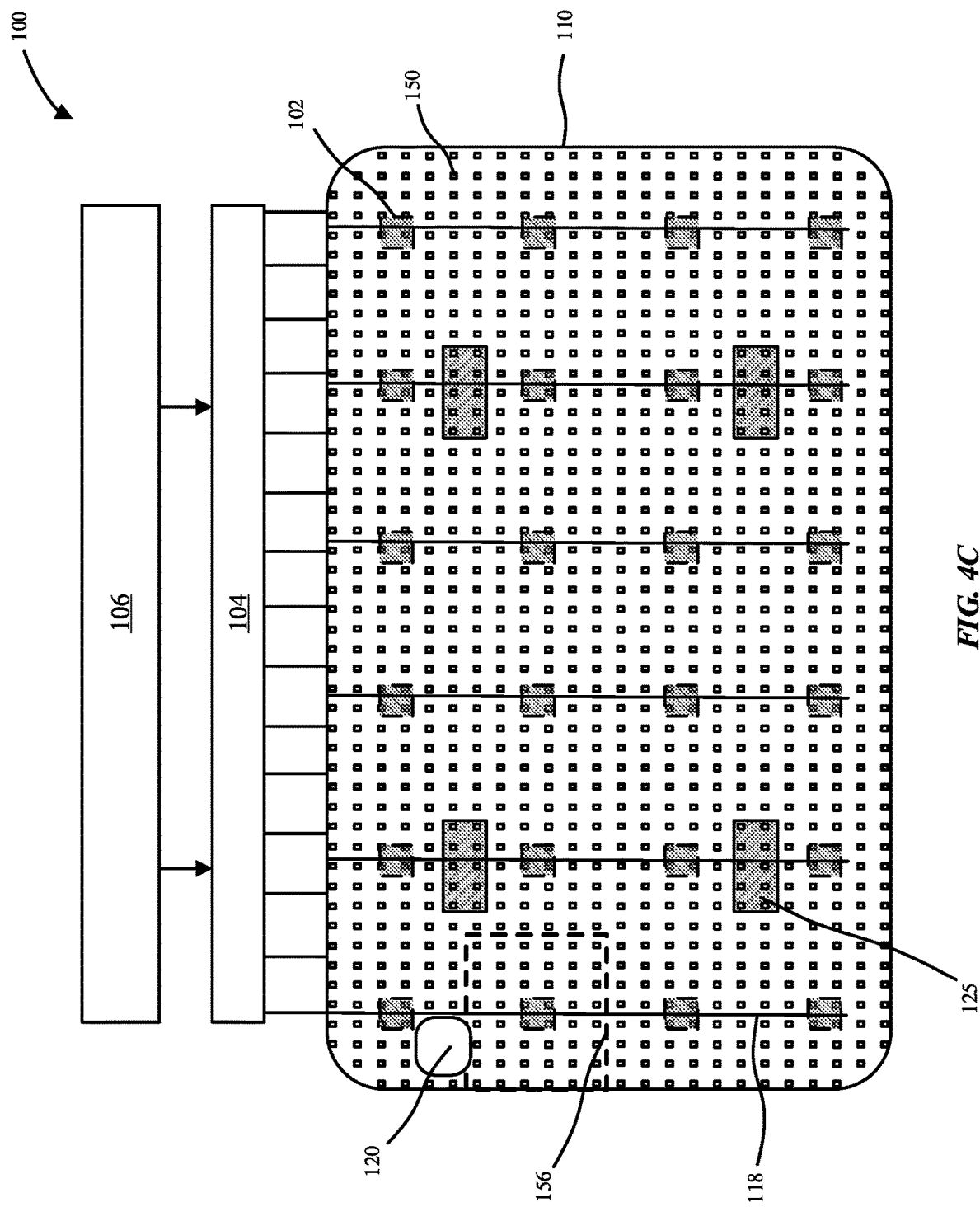

Referring now to FIG. 4C, another alternative display system 100 is illustrated including distributed row drivers 125. The embodiment illustrated in FIG. 4C is similar to that illustrated in FIG. 4B, where row drivers are instead distributed row drivers 125 that are distributed, or embedded, across the display area rather than along edges of the display panel 110. Similar to FIGS. 4A-4B, column drivers 122 may optionally be included.

As shown in FIGS. 4A-4C, the local active matrix architecture in accordance with embodiments is compatible with a variety of arrangements of pixel driver chips 102, and inclusion of various levels of global signal buffering traditionally segregated into row drivers and column drivers.

Figure 5:
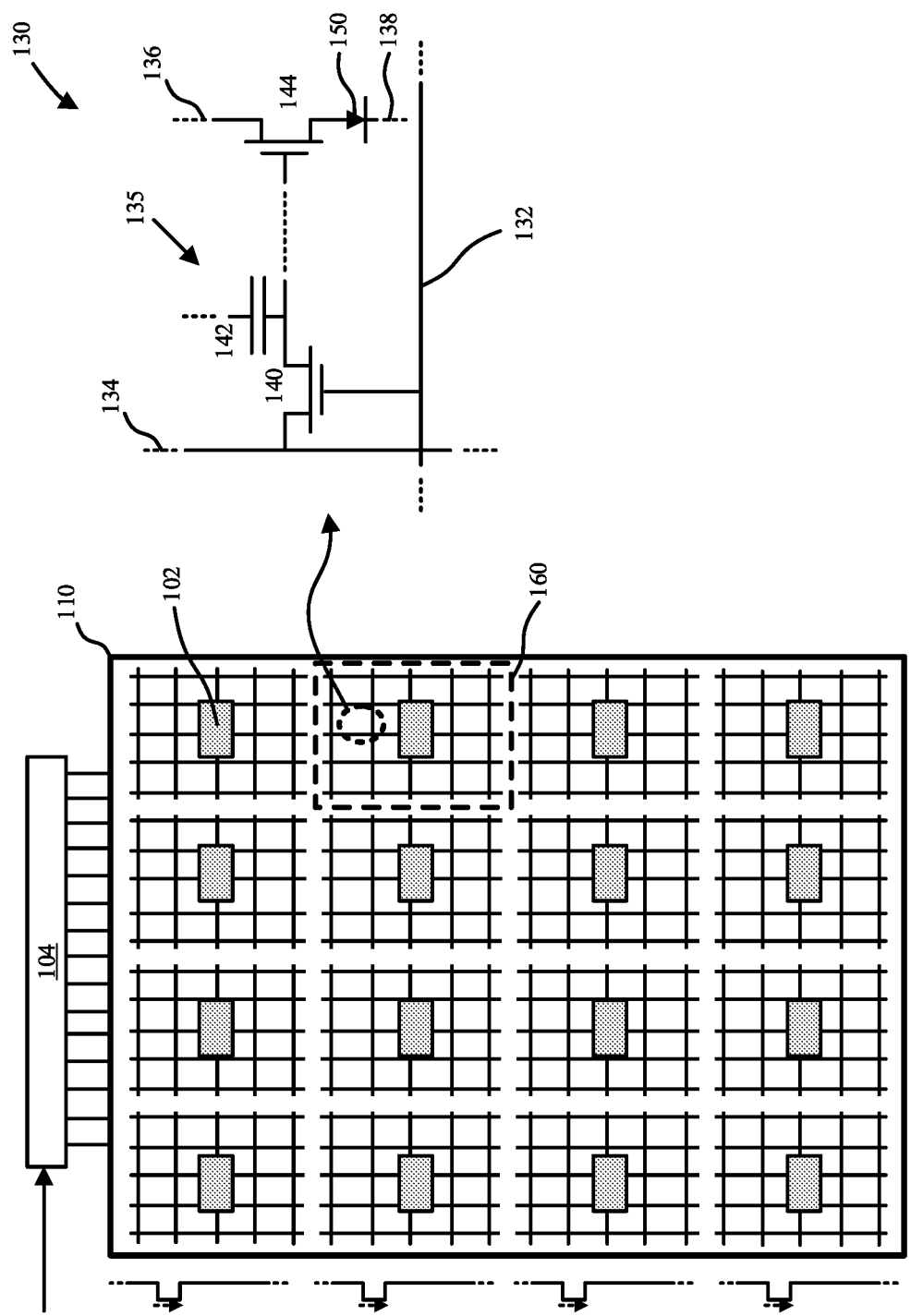
FIG. 5 is a schematic top layout view of a display panel and close-up generalized circuit diagram of a local subpixel circuit in accordance with an embodiment.
Figure 7:
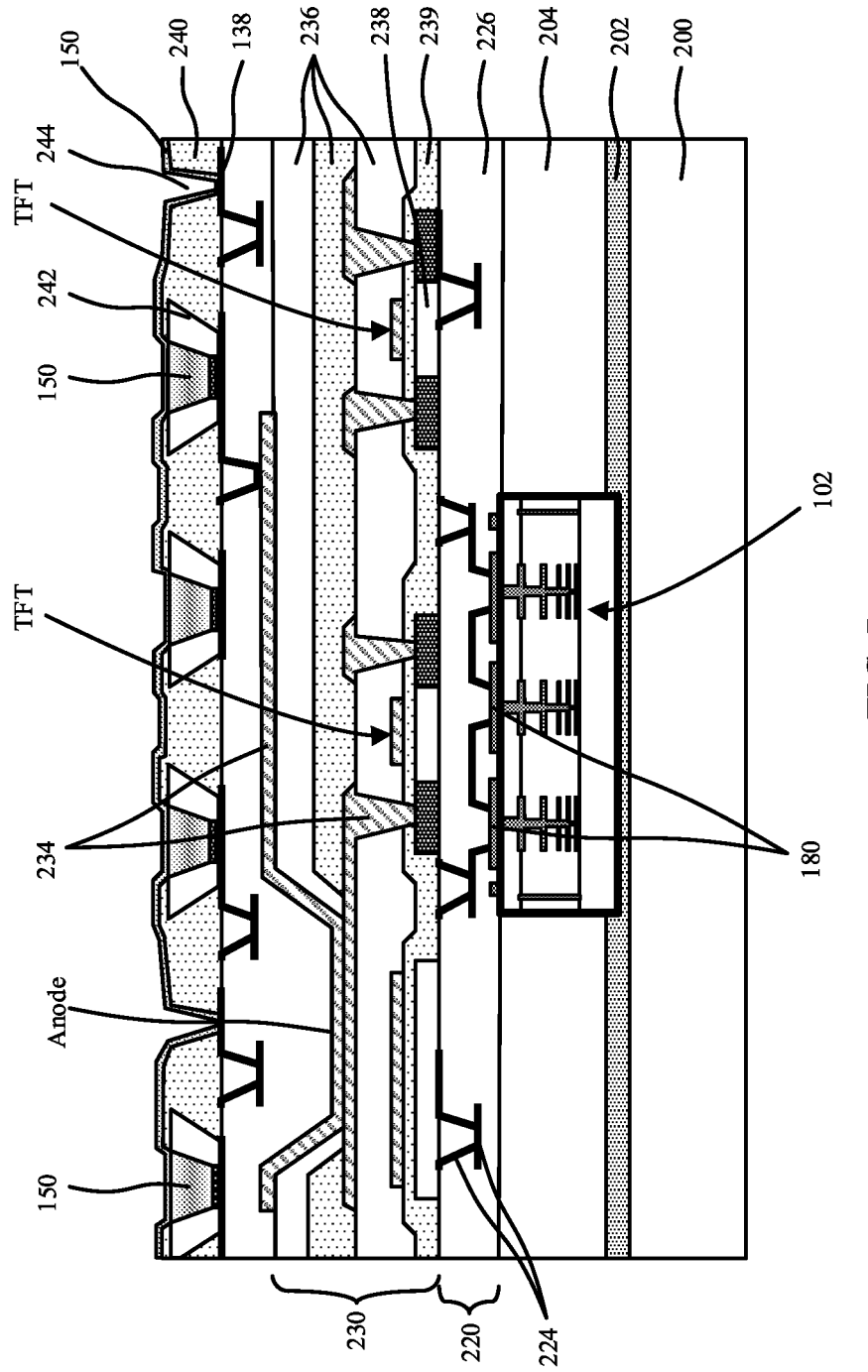
FIG. 7 is a schematic cross-sectional side view illustration of a portion of a local active matrix stack-up in accordance with an embodiment.

Referring now to FIG. 5, a schematic top layout view of a display panel 110 and close-up generalized circuit diagram of a local subpixel circuit 130 are provided in accordance with an embodiment. As shown, local pixel circuit matrices 160 are connected to respective pixel driver chips 102. Each local pixel circuit matrix 160 and local subpixel circuit 130 may be primarily located in a TFT layer 230 (which may include multiple layers) above the pixel driver chips 102 as shown in FIG. 7. Specifically, the local pixel circuit matrices 160 in FIG. 5 illustrate the local circuitries connected to a single pixel driver chip 102, which controls a matrix of pixels. Thus, as shown, the TFT layer may include an array of local pixel circuit matrices 160 that correspond to the matrices 156 of LEDs 150 described with regard to FIGS. 4A-4C.

As shown in the close-up diagram, each local subpixel circuit 130 can include a memory cell 135 coupled with a local emission data line 134 from the pixel driver chip 102 and a local scan line 132 from the pixel driver chip 102. In an embodiment, the memory cell 135 includes a switch 140, such as a thin film transistor, and a storage device 142, such as a capacitor. The local emission data line 134 may be coupled with a plurality of (rows) local subpixel circuits 130 within the local pixel circuit matrix 160. The local scan line 132 may be coupled with a plurality of (columns) local subpixel circuits 130 within the local pixel circuit matrix 160. Thus, each local pixel circuit matrix 160 may include a plurality of columns of local emission data lines 134, and a plurality of rows of local scan lines 132.

Still referring to FIG. 5, in accordance with embodiments each local pixel circuit matrix 160 may include a power grid formed with high voltage power supply lines 136 and low voltage power supply lines 138. As shown, each local subpixel circuit includes a high voltage power supply line (e.g. Vdd) 136 and low voltage power supply line (e.g. Vss) 138 coupled to a LED 150. More specifically, the high voltage power supply line 136 may be connected to a first source/drain terminal of a drive transistor 144, with the LED 150 connected to the other source/drain terminal, and the memory cell 135 connected to the gate of the drive transistor 144. In an embodiment, the high voltage power supply line 136 and low voltage power supply line 138 are coupled to output terminals for a pixel driver chip 102. Furthermore, input terminals for the pixel driver chip 102 may be coupled to global power supply lines, such as those included within bus columns 114 and row signal lines 116, or global power supply lines distributed across the display panel similarly as the global data lines 118. In an embodiment the power grid for a local pixel circuit matrix is wholly contained within the local pixel circuit matrix 160 and connected to a corresponding pixel driver chip 102. In such a configuration, the pixel driver chip 102 receives the global power input and can regulate the local power lines (high voltage power supply line 136, low voltage power supply line 138) for the local active matrix (i.e. the local pixel circuit matrix 160). In accordance with some embodiments, the pixel driver chip 102 can be responsible for providing all relevant power and addressing signals to the "stand-alone" local active matrix. In an alternative arrangement, the high voltage power supply line 136 and/or low voltage power supply line 138 can be coupled to the global power supply lines. In such an alternative configuration, pixel current can be generated globally using global reference voltage (Vref) lines, for example, distributed through the backbone or otherwise.

In an embodiment, a method of operating an LAM display panel includes receiving a global data signal (e.g. digital data signal) at a pixel driver chip 102 of an array of pixel driver chips interspersed within a display area of a display panel 110. For example, this may be at an input terminal coupled with a global data line 118, or through the backbone, row signal lines 116, etc. A first subpixel memory cell 135 is then programmed with first local emission data from the pixel driver chip 102, where the first subpixel memory cell 135 is located within a first local subpixel circuit 130 outside of the pixel driver chip 102. Light is then emitted from a first LED 150 within the first local subpixel circuit 130. In an embodiment, programming the first subpixel memory cell 135 with the local emission data includes sending a column data signal (e.g. along local data line 134) and a row scan signal (e.g. along local scan line 132) from the pixel driver chip 102 to a switch 140 (e.g. transistor) in the first subpixel memory cell 135.

The LAM addressing schemes in accordance with embodiments may include programming of the subpixel memory cells one row at a time. Referring again to FIG. 3, the first (top) rows of local subpixel circuits 130 and corresponding memory cells can be programmed, followed by programming the second (middle) row, followed by programming the third (bottom) row, and so on. Additionally, all columns within a same row are programmed at the same time. It is to be appreciated that the illustrated current sharing, and multiplexing, in the LAM addressing scheme is actually programming current, and is not the LED driving current as those described and illustrated for LPM addressing and AM addressing. Instead, the LED driving current is provided by the power grid (high voltage power supply line 136 and/low voltage power supply line 138) as they relate to the programmed memory cell 135. Lower currents can be used for turning on the switch 140 compared to LED driving currents, which can lower power required. This reduces peak current that is supplied to the LEDs 150 and allowed the LAM architecture and addressing scheme to be used for micro LED as well as OLED. Additionally, row sharing is involved during programming, once the memory cells 135 are programmed, the charged storage device 142 (capacitor) turns on the driving transistor 144, which stays on until the memory cell 135 is reprogrammed. Thus, time sharing of the current source with LPM addressing is eliminated with LAM addressing. In operation, the driving transistors 144 remain on until reprogrammed, even during programming and emitting from the following row. Referring to FIG. 5 in combination with FIG. 3, in an embodiment, the driving transistor 144 connected to a programmed memory cell 135 and first LED 150 (e.g. top row) is on, even while emitting light from a second LED 150 (e.g. middle row, same column) or programming a second memory cell 135 coupled to the second LED 150. Thus, all driving transistors 144 from all columns in a first row (e.g. top row) can remain on during the rest of the programming operations where the succeeding rows are programed for that frame. The same relationship goes on for the succeeding rows. Such an addressing scheme may be further facilitated by additional emission switches, etc.

Figure 6:
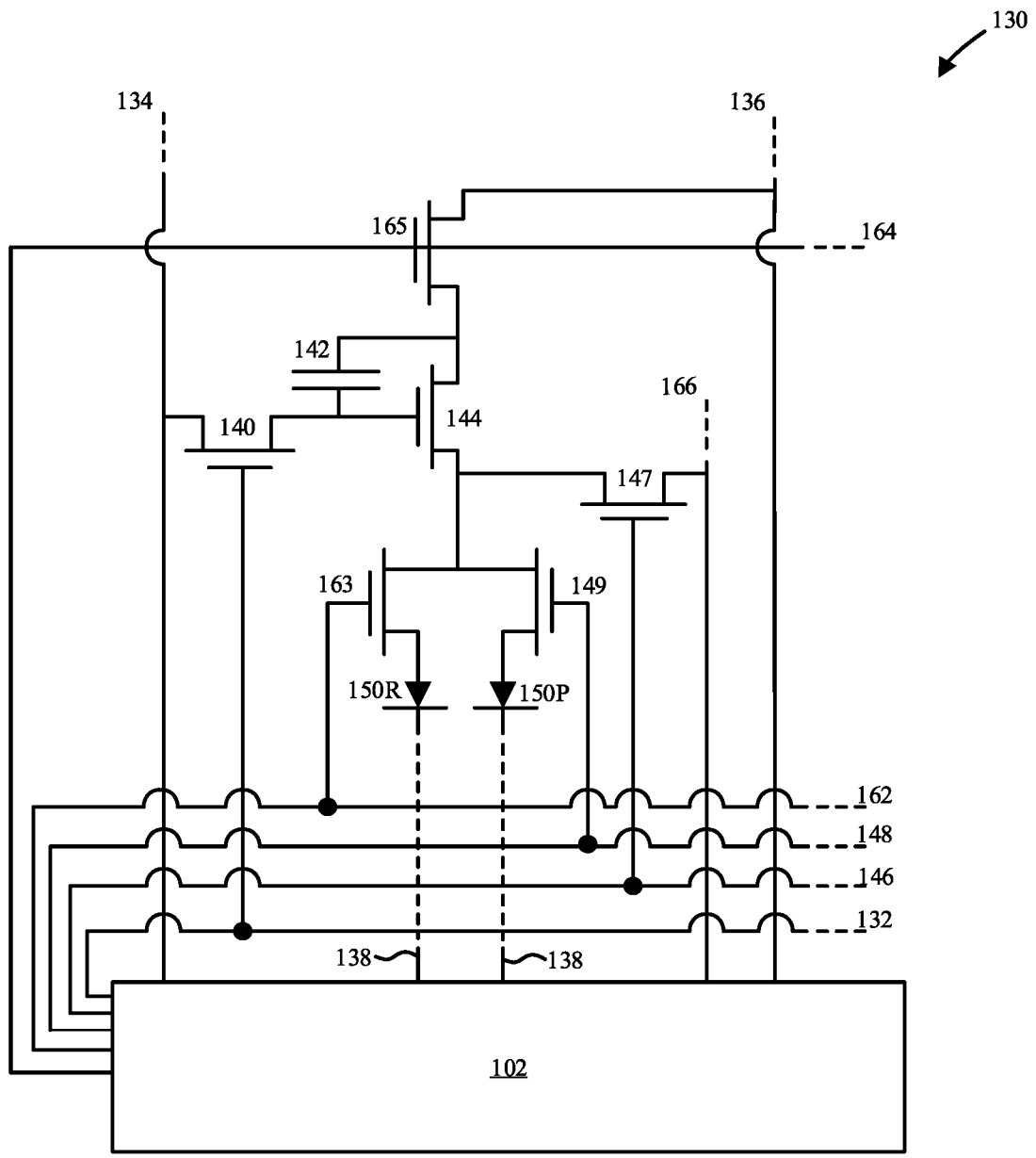
FIG. 6 is a circuit diagram of a local subpixel circuit in accordance with an embodiment.

FIG. 6 is a circuit diagram of a local subpixel circuit 130 in accordance with an embodiment. FIG. 6 is similar to the generalized circuit diagram of a local subpixel circuit 130 of FIG. 5, with the addition of emission, sensing, and LED redundancy circuitry. Similar to FIG. 5, the local subpixel circuit 130, and local pixel circuit matrix 160 may be wholly connected to local input/output terminals of the pixel driver chip 102, and thus, not connected to any global signal or power lines. As shown, the column data line 134 may connect a column of local subpixel circuits 130. Likewise, the high voltage power supply line 136, low voltage power supply line 138, and column sense line 166 may connect to the same column of local subpixel circuits 130. Similarly, a row scan line 132, row sense line 146, primary LED row select line 148, and redundant LED row select line 162, and row emit lines 164 can be connected to a row of local subpixel circuits 130.

In the particular embodiment illustrated, row emit line 164 is connected to the emission control switch 165 (e.g. transistor) for the local subpixel circuit 130. In operation, selection of the row emit line 164 turns on the emission control switches 165. Since the driving transistors 144 are on after being programmed this allows emission from the LEDs 150. Since this is a redundant configuration, emission will occur for either the primary LED 150P or redundant LED 150R, depending upon whether primary switch 149 (transistor) or redundant switch 163 (transistor) is turned on. A sense circuit may optionally be included, with sense switch (transistor) 147 coupled with row sense line 146 and column sense line 166.

Each of the switches, or transistors, in the illustrated local subpixel circuits may be TFTs. It is to be appreciated that the particular local subpixel circuits 130 illustrated in FIGS. 5-6 are exemplary and embodiments are not so limited. Other circuit implementations can be used to reduce the number of TFTs and input/output connections to the pixel driver chip 102. For example, the emission control switch 165 can be replaced by providing a pixel driver chip 102 current supply per column directly to driving transistor 144, and sense switch 147 can be combined with the driving transistor 144 using the pixel driver chip 102 current supply for sensing. Furthermore, the primary LED 150P and redundant LED 150R terminals to the pixel driver chip 102 can be combined if NMOS and PMOS are used as the primary switch 149 and redundant switch 163, or the switching is from the pixel driver chip 102.

Figure 8:
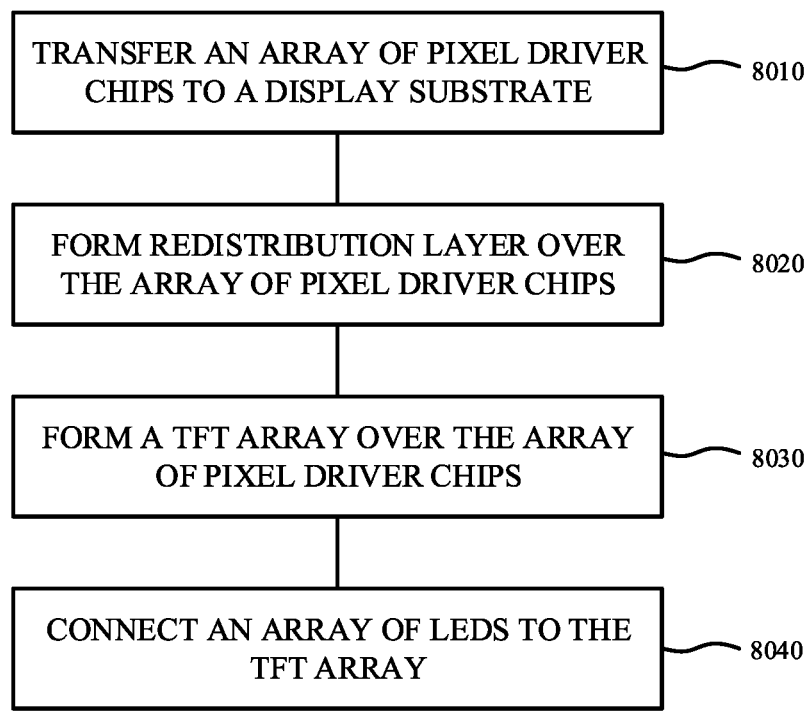
FIG. 8 is a flow chart for a method of fabricating a local passive matrix display panel in accordance with an embodiment.

Referring now to FIG. 7, a cross-sectional side view illustration is provided of a portion of an LPM stack-up in accordance with an embodiment. FIG. 8 is a flow chart for a method of fabricating an LPM display panel in accordance with an embodiment. In interest of conciseness, FIGS. 7-8 are described concurrently together.

In an embodiment, a LAM display panel includes an array of pixel driver chips 102, a thin film transistor TFT layer 230 over and in electrical contact with the array of pixel driver chips 102, and an array of LEDs 150 on the TFT layer 230. As previously described, the pixel driver chips 102 may be designed for digital provide local matrix digital driving capability and may be designed to receive digital data signals and include a digital data storage module. Each pixel driver chip 102 may be electrically connected to a corresponding matrix 156 of LEDs 150 and corresponding local pixel circuit matrices 160, which may be formed in the TFT layer 230. In an alternative configuration, the TFT layer 230 can be fabricated, followed by placement of the pixel driver chips 102 onto the TFT layer 230. In such a configuration the pixel driver chips 102 would be over the TFT layer 230. Vertical interconnects, such as through vias or copper pillars could then provide electrical connection from the TFT layer 230 though the passivation layer 204 to the LEDs 150. Optionally, a top side redistribution layer could be formed over the passivation layer to provide additional routing between the vertical interconnects and LEDs 150.

Method of manufacture may include transferring an array of pixel driver chips 102 to a display substrate 200 at operation 8010. For example, the display substrate 102 may be a rigid or flexible substrate, such as glass, polyimide, etc. An adhesion layer 202 may optionally be formed on the display substrate 200 to receive the pixel driver chips 102. Transfer may be accomplished using a pick and place tool. In an embodiment, a back side (non-functionalized) side is placed onto the adhesion layer 202, with the front side (active side, including contact pads 180) placed face up. The contact pads 180 may be formed before or after transfer. As illustrated, a passivation layer 204 can be formed around the pixel driver chips 102, for example, to secure the pixel driver chips 102 to the display substrate 102, and to provide step coverage for additional routing. Suitable materials for passivation layer 204 include polymers, spin on glass, oxides, etc. In an embodiment, passivation layer is a thermoset material such as acrylic, epoxy, benzocyclobutene (BCB), etc.

A redistribution layer (RDL) 220 may then be formed over the array of pixel driver chips 102. The RDL may, for example, fan out from the contact pads 180 to provide connections for the TFT layer 230 which is then formed at operation 8030. As shown in FIG. 7, the RDL 220 may include one or more redistribution lines 224 and dielectric layers 226. For example, redistribution lines may be metal lines (e.g. Cu, Al, etc.) and the dielectric layers 226 may be formed of suitable insulating materials including oxides (e.g. SiOx), nitrides, polymers, etc. In accordance with embodiments, RDL 220 includes one or more of the plurality global signal lines and power lines (e.g. data lines 118, row signal lines 116, bus columns 114, etc.).

Any of the plurality of global signal lines and power lines may also, or alternatively, be formed in the TFT layer 230. In an embodiment, the TFT layer 230 is used primarily for local routing. The TFT layer 230 may include an array of TFTs, capacitors, and electrical routing. For example, the TFTs may be silicon or oxide transistors. In the embodiment illustrated, the TFTs include silicon channels 238 and oxide gate layers 239. Similar to RDL 220, the TFT layer 230 may additionally include a plurality of metal routing lines 234 and dielectric layers 236. Routing lines 234 (or vias thereof) may contact the source/drains of the TFTs. In the illustrated embodiment, the top metal routing line 234 is an anode for the local subpixel circuit.

At this stage in the manufacturing process, the display panel may be suitable for subsequent processing for both micro LED and OLED. At operation 8080 an array of LEDs is connected to the TFT array. In an OLED manufacturing process, this may include deposition of the organic emission layers, and then pixel defining layers. In the micro LED manufacturing process illustrated in FIG. 7, additional dielectric layers and routing layers may optionally be formed followed by the transfer and bonding of micro LEDs 150 onto the stack-up. In an embodiment, the micro LEDs 150 are bonded inside bank structure openings 242 in a bank layer 240. The bank structure openings 242 may optionally be reflective and may optionally be filled after bonding of the micro LEDs 150. The bank layer 240 may be further patterned to create openings 244 to expose a routing layer, such as low voltage power supply lines 138, or cathodes. A top transparent or semi-transparent electrically conductive layer(s) can then be deposited to provide electrical connection from the top sides of the micro LEDs 150 to the low voltage power supply lines 138, or cathodes. Suitable materials include transparent conductive oxides (TCOs), conductive polymers, thin transparent metal layers, etc. Further processing may then be performed for encapsulation, polarizer, etc.

Figure 9:
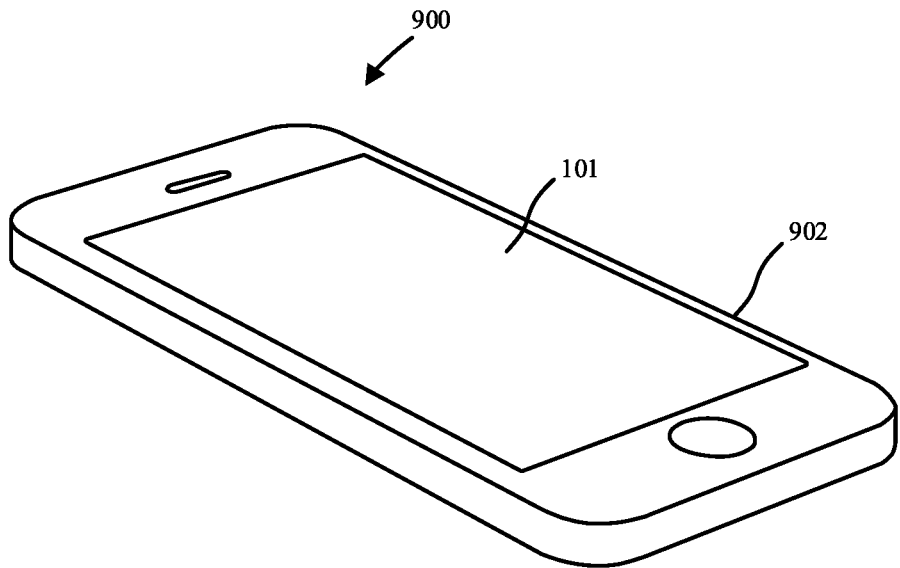
FIG. 9 is an isometric view of a mobile telephone in accordance with an embodiment.
Figure 10:
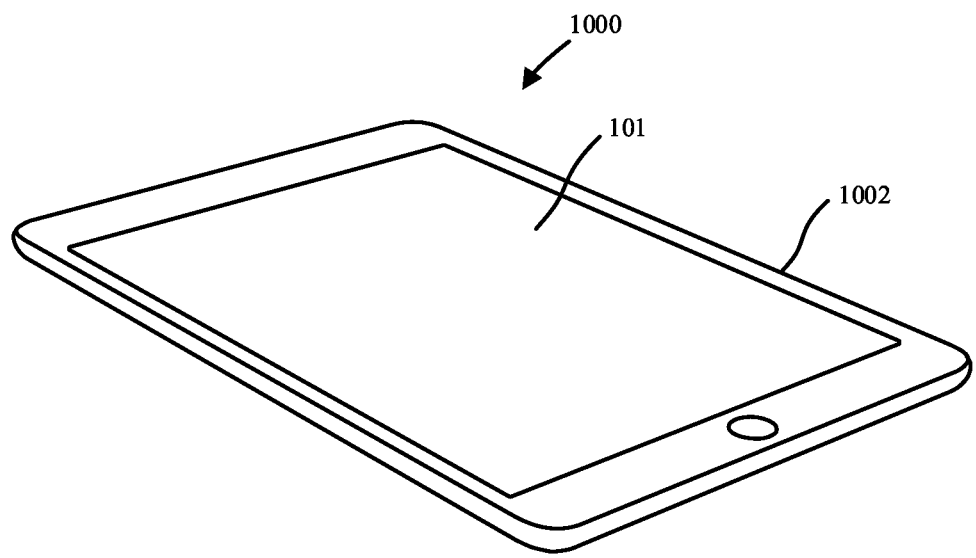
FIG. 10 is an isometric view of a tablet computing device in accordance with an embodiment.
Figure 11:
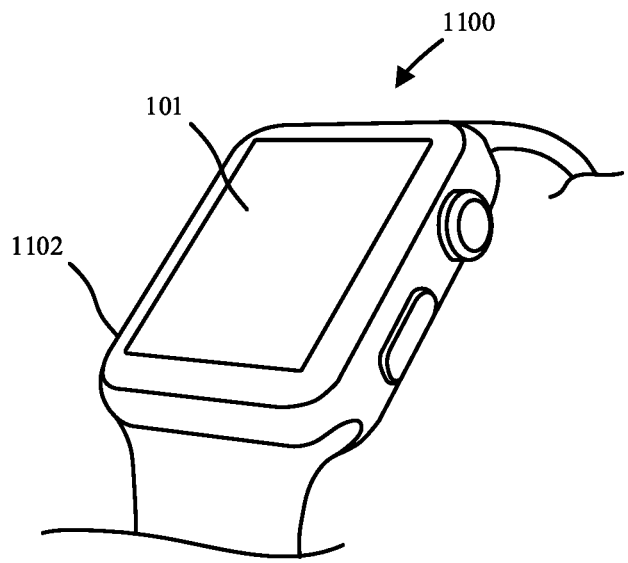
FIG. 11 is an isometric view of a wearable device in accordance with an embodiment.
Figure 12:
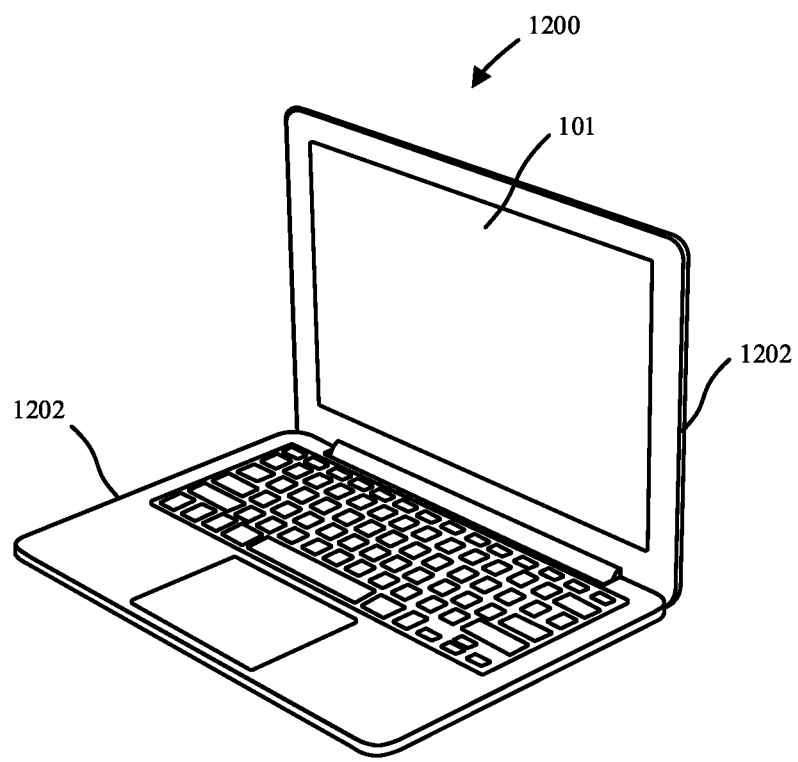
FIG. 12 is an isometric view of a laptop computer in accordance with an embodiment.

FIGS. 9-12 illustrate various portable electronic systems in which the various embodiments can be implemented. FIG. 9 illustrates an exemplary mobile telephone 900 that includes a display system 100 including a display screen 101 packaged in a housing 902. FIG. 10 illustrates an exemplary tablet computing device 1000 that includes a display system 100 including a display screen 101 packaged in a housing 1002. FIG. 11 illustrates an exemplary wearable device 1100 that includes a display system 100 including a display screen 101 packaged in a housing 1102. FIG. 12 illustrates an exemplary laptop computer 1200 that includes a display system 100 including a display screen 101 packaged in a housing 1202.

Figure 13:
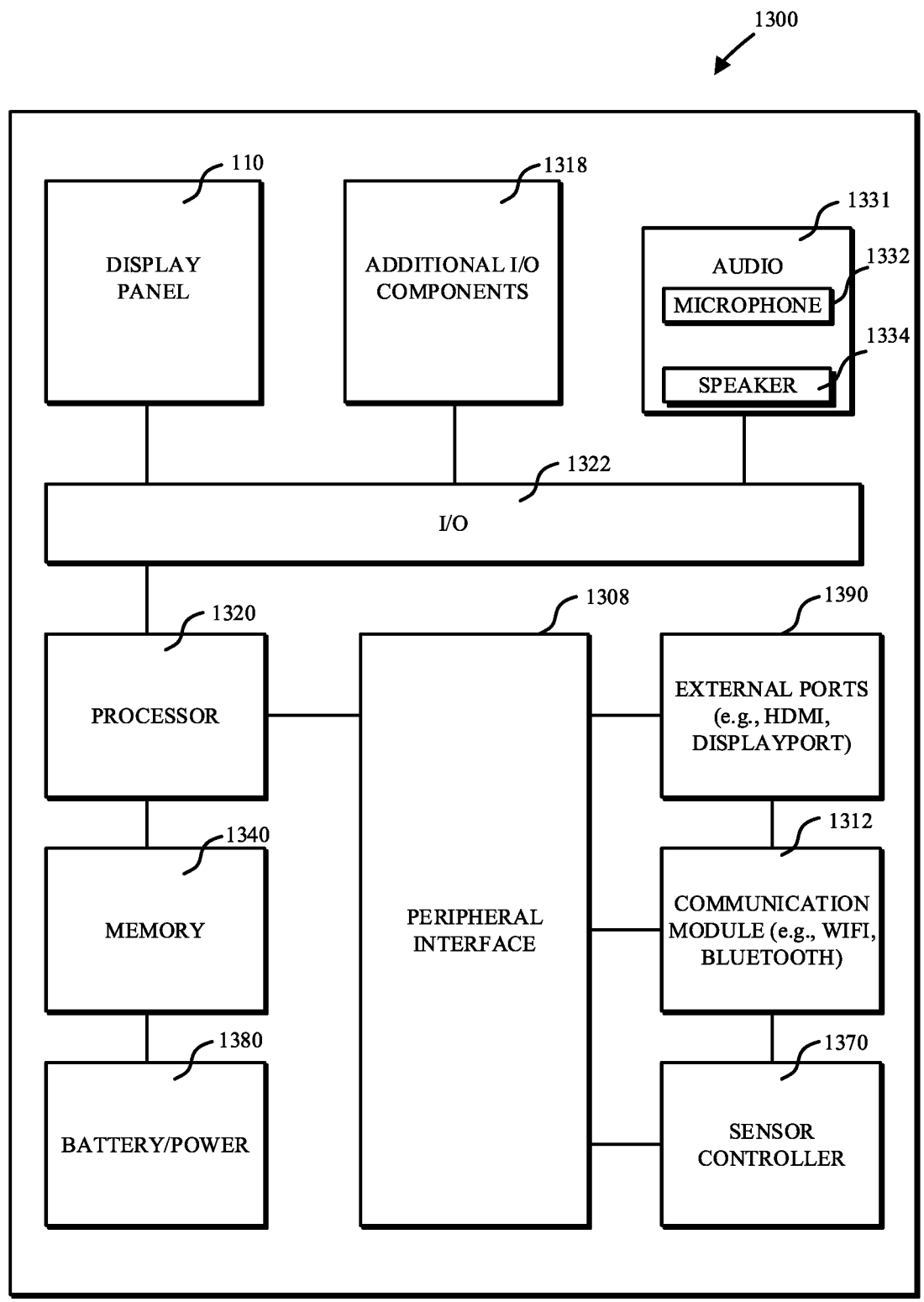
FIG. 13 is a system diagram of a portable electronic device in accordance with an embodiment.

FIG. 13 illustrates a system diagram for an embodiment of a portable electronic device 1300 including a display panel 110 described herein. The portable electronic device 1300 includes a processor 1320 and memory 1340 for managing the system and executing instructions. The memory includes non-volatile memory, such as flash memory, and can additionally include volatile memory, such as static or dynamic random access memory (RAM). The memory 1340 can additionally include a portion dedicated to read only memory (ROM) to store firmware and configuration utilities.

The system also includes a power module 1380 (e.g., flexible batteries, wired or wireless charging circuits, etc.), a peripheral interface 1308, and one or more external ports 1390 (e.g., Universal Serial Bus (USB), HDMI, Display Port, and/or others). In one embodiment, the portable electronic device 1300 includes a communication module 1312 configured to interface with the one or more external ports 1390. For example, the communication module 1312 can include one or more transceivers functioning in accordance with IEEE standards, 3GPP standards, or other communication standards, and configured to receive and transmit data via the one or more external ports 1390. The communication module 1312 can additionally include one or more WWAN transceivers configured to communicate with a wide area network including one or more cellular towers, or base stations to communicatively connect the portable electronic device 1300 to additional devices or components. Further, the communication module 1312 can include one or more WLAN and/or WPAN transceivers configured to connect the portable electronic device 1300 to local area networks and/or personal area networks, such as a Bluetooth network.

The display system 1300 can further include a sensor controller 1370 to manage input from one or more sensors such as, for example, proximity sensors, ambient light sensors, or infrared transceivers. In one embodiment the system includes an audio module 1331 including one or more speakers 1334 for audio output and one or more microphones 1332 for receiving audio. In embodiments, the speaker 1334 and the microphone 1332 can be piezoelectric components. The portable electronic device 1300 further includes an input/output (I/O) controller 1322, a display panel 110, and additional I/O components 1318 (e.g., keys, buttons, lights, LEDs, cursor control devices, haptic devices, and others). The display panel 110 and the additional I/O components 1318 may be considered to form portions of a user interface (e.g., portions of the portable electronic device 1300 associated with presenting information to the user and/or receiving inputs from the user).

In utilizing the various aspects of the embodiments, it would become apparent to one skilled in the art that combinations or variations of the above embodiments are possible for forming and operating a local active matrix display. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A local active matrix display panel, comprising:
an array of pixel driver chips;
a thin film transistor (TFT) layer in electrical contact with the array of pixel driver chips;
an array of light emitting diodes (LEDs) electrically connected with the TFT layer;
wherein the TFT layer includes a local pixel circuit matrix connected with a pixel driver chip of the array of pixel driver chips, the local pixel circuit matrix including a power grid formed by a plurality of low voltage power supply lines and a plurality of high voltage power supply lines coupled to LEDs in the array of LEDs.

2. The local active matrix display panel of claim 1, wherein the plurality of low voltage power supply lines and the plurality of high voltage power supply lines are coupled to the pixel driver chip.

3. The local active matrix display panel of claim 2, wherein the pixel driver chip is coupled to global power supply lines.

4. The local active matrix display panel of claim 1, wherein the plurality of low voltage power supply lines and the plurality of high voltage power supply lines are coupled to global power supply lines.

5. The local active matrix display panel of claim 1, wherein the pixel driver chip includes a plurality of local scan line outputs.

6. The local active matrix display panel of claim 5, wherein the local pixel circuit matrix includes a plurality of local scan lines connected to the plurality of local scan line outputs, each local scan line connected to a separate row of local subpixel circuits within the local pixel circuit matrix.

7. The local active matrix display panel of claim 6, wherein the pixel driver chip includes a plurality of high voltage power supply line outputs.

8. The local active matrix display panel of claim 7, wherein the plurality of high voltage power supply lines is connected to the plurality of high voltage power supply line outputs, each high voltage power supply line connected to a separate column of local subpixel circuits within the local pixel circuit matrix.

9. The local active matrix display panel of claim 8, wherein the pixel driver chip includes a plurality of low voltage power supply line outputs.

10. The local active matrix display panel of claim 9, wherein the plurality of low voltage power supply lines is connected to the plurality of low voltage power supply line outputs, each low voltage power supply line connected to a separate column of local subpixel circuits within the local pixel circuit matrix.

11. The local active matrix display panel of claim 10, wherein each local subpixel circuit includes a drive transistor with a high voltage power supply line connected to a first source/drain terminal of the drive transistor.

12. The local active matrix display panel of claim 11, wherein each low voltage power supply line is connected to a plurality of LEDs in the separate column of local subpixel circuits.

13. The local active matrix display panel of claim 12, wherein the array of pixel driver chips includes a plurality of driving pixel driver chips and a plurality of hybrid pixel driver chips.

14. The local active matrix display panel of claim 13, further comprising a bus column of global signal lines coupled with the plurality of hybrid pixel driver chips.

15. The local active matrix display panel of claim 14, wherein each hybrid pixel drive chip is connected to a group of driving pixel driver chips with a row signal line to transmit a manipulated row signal to the group of driving pixel driver chips.

16. The local active matrix display panel of claim 13, wherein the pixel driver chip includes a global power input.

17. The local active matrix display panel of claim 13, wherein the pixel driver chip provides power and addressing signals to the local pixel circuit matrix.

18. The local active matrix display panel of claim 13, wherein the power grid is wholly contained within the local pixel circuit matrix and is connected to the pixel driver chip.

19. The local active matrix display panel of claim 13, wherein the power grid is connected to at least one global power supply line.

20. The local active matrix display panel of claim 13, wherein the pixel driver chip includes a digital data storage module.

* * * * *